(12) United States Patent
Jarek

(10) Patent No.: US 6,525,152 B1
(45) Date of Patent: Feb. 25, 2003

(54) COPOLYMER FOR IMPROVING THE CHEMICAL AND DEVELOPER RESISTANCE OF POSITIVE WORKING PRINTING PLATES

(75) Inventor: Mathias Jarek, Northeim (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/630,917

(22) Filed: Aug. 2, 2000

(30) Foreign Application Priority Data

Aug. 2, 1999 (DE) .......................... 199 36 331

(51) Int. Cl.$^7$ .................. C08F 222/40; C08F 122/40; G03F 7/023
(52) U.S. Cl. .................. 526/262; 526/303.1; 526/307.1; 526/318.4; 526/326; 430/191; 430/192; 430/193; 430/165; 430/270.1
(58) Field of Search .............. 430/270.1, 192, 430/191; 526/262, 303.1, 307.1, 318.4, 326

(56) References Cited

U.S. PATENT DOCUMENTS

RE34,061 E * 9/1992 Kawai et al. ............... 526/282
6,190,825 B1 * 2/2001 Denzinger et al. .......... 430/192

* cited by examiner

Primary Examiner—John S. Chu

(74) Attorney, Agent, or Firm—Faegre & Benson LLP

(57) ABSTRACT

Copolymers useful in radiation-sensitive layers of printing plates have the units A, B and C

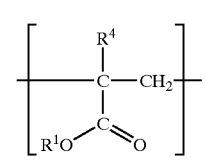

A

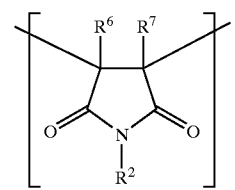

B

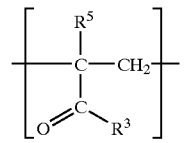

C wherein unit A is present in an amount of 5 to a maximum of 50 mol % and $R^1$ and $R^4$ are selected such that the homopolymer of A is alkali-soluble, B is present in an amount of 20–70 mol % and $R^2$, $R^6$ and $R^7$ are selected such that the homopolymer of B has a high glass transition temperature, and C is present in an amount of 10–50 mol % and $R^3$ and $R^5$ are selected such that the homopolymer of C is water-soluble and that unit A is different from unit C.

9 Claims, 3 Drawing Sheets

COPOLYMER FOR IMPROVING THE CHEMICAL AND DEVELOPER RESISTANCE OF POSITIVE WORKING PRINTING PLATES

BACKGROUND OF THE INVENTION

1. Field of the Invention

The present invention relates to copolymers and their use in radiation-sensitive layers of printing plates and the like; in particular, the invention relates to copolymers which increase the chemical and developer resistance of radiation-sensitive layers in positive working printing plates, printed circuit boards for integrated circuits and photomasks.

2. Background Information

Recently, the resistance of offset printing plates to solvents and common printing room chemicals such as plate cleaning agents or rubber blanket washing agents as well as to alcohol substitutes in the fountain water has had to meet ever increasing demands. Particularly in printing processes using UV-curing inks, where rinsing agents with a high content of esters, ethers or ketones are used, the chemical resistance of conventional positive working printing plates is no longer sufficient without special stabilizing processes. In order to improve the chemical resistance of positive working offset printing plates, three approaches have essentially been discussed:

1) In the most basic case, positive working offset printing plates comprise two components, namely a naphthoquinone diazide derivative (NQD derivative) and a novolak. One possibility is to chemically alter the NQD such that it is imparted an increased chemical and solvent resistance (e.g. U.S. Pat. No. 5,609,983). The disadvantage of this method is that the resistance of a printing plate produced therefrom cannot be increased indefinitely by increasing the NQD content since the NQD content has to lie in a certain range to make sense from a practical point of view.

2) Another approach is to thermally stabilize a conventional positive working printing plate (based on novolak and NQD). This can be carried out either by "baking" or by means of the Pulsar™ process. During baking, a completely developed printing form is heated to about 230° C. for a few minutes causing the mostly phenolic binders to cross-link. This results in an extremely high chemical and mechanical resistance. In the other thermal process (i.e. the Pulsar™ process), the developed printing plate is subjected to a short-time "shock heating" to about 175° C. This results in a slight cross-linking (and thus an increase in the chemical resistance) of the image areas. For the user, the two thermal stabilizing processes entail the important disadvantage that they require somewhat complicated apparatuses and are therefore quite costly.

3) A third option is the change of the binder content of a radiation-sensitive composition. For example, additives can be added to the formulation. However, in the case of commercially available additives, the amount to be added is often limited since these substances are not adapted to the composition and therefore most of the time affect the properties of the printing plate when added at too high a concentration.

Another frequently used method is the use of higher molecular novolaks; however, this leads to a deterioration of the photosensitivity of the composition which leads to a considerable loss of time for the user, particularly in the case of high numbers of prints or when so-called "Step & Repeat" exposure machines are used.

Furthermore, the properties of the binders in the photosensitive composition can be improved by way of chemical modification. Since such special binders with a high degree of chemical resistance are either not commercially available or very expensive (e.g. EP-A-0 737 896), it is often necessary that the manufacturers develop their own binders. In order to avoid high costs in the developing process, efforts have to be made to keep the synthetic requirements for preparing such tailor-made high-performance binders as simple as possible.

Therefore, despite intensive research in the field of chemically resistant binders for offset printing plates, the available approaches to solve the problem still leave some improvements to be desired, in particular with respect to binders that can be used more flexibly and are less expensive.

It is therefore an object of the present invention to provide inexpensive copolymers which significantly increase the chemical resistance of the radiation-sensitive layer in printing forms, printed circuit boards for integrated circuits and photomasks without suffering the disadvantages described above. Furthermore, development with conventional developers should be possible and a high degree of radiation sensitivity, good resolution and quick ink acceptance should be guaranteed. It is another object of the present invention to provide a process for the preparation of such copolymers.

SUMMARY OF THE INVENTION

The objects of this invention are achieved by a copolymer consisting of the units A, B and C wherein unit A is present in an amount of at least 5 to a maximum of 50 mol % and has the following formula

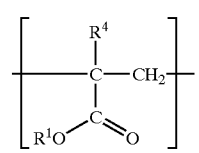

A wherein $R^1$ and $R^4$ are selected such that the homopolymer of A is alkali-soluble, unit B is present in an amount of 20 to 70 mol % and has the following formula

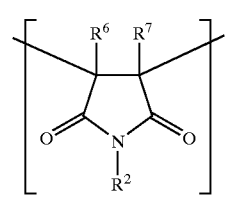

B wherein $R^2$, $R^6$ and $R^7$ are selected such that the homopolymer of B has a high glass transition temperature, and unit C is present in an amount of 10 to 50 mol % and has the following formula

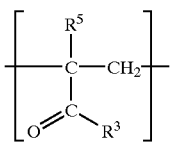

wherein $R^3$ and $R^5$ are selected such that the homopolymer of C is water-soluble, with the proviso that unit C is different from unit A.

DETAILED DESCRIPTION OF THE INVENTION

Figure 1:
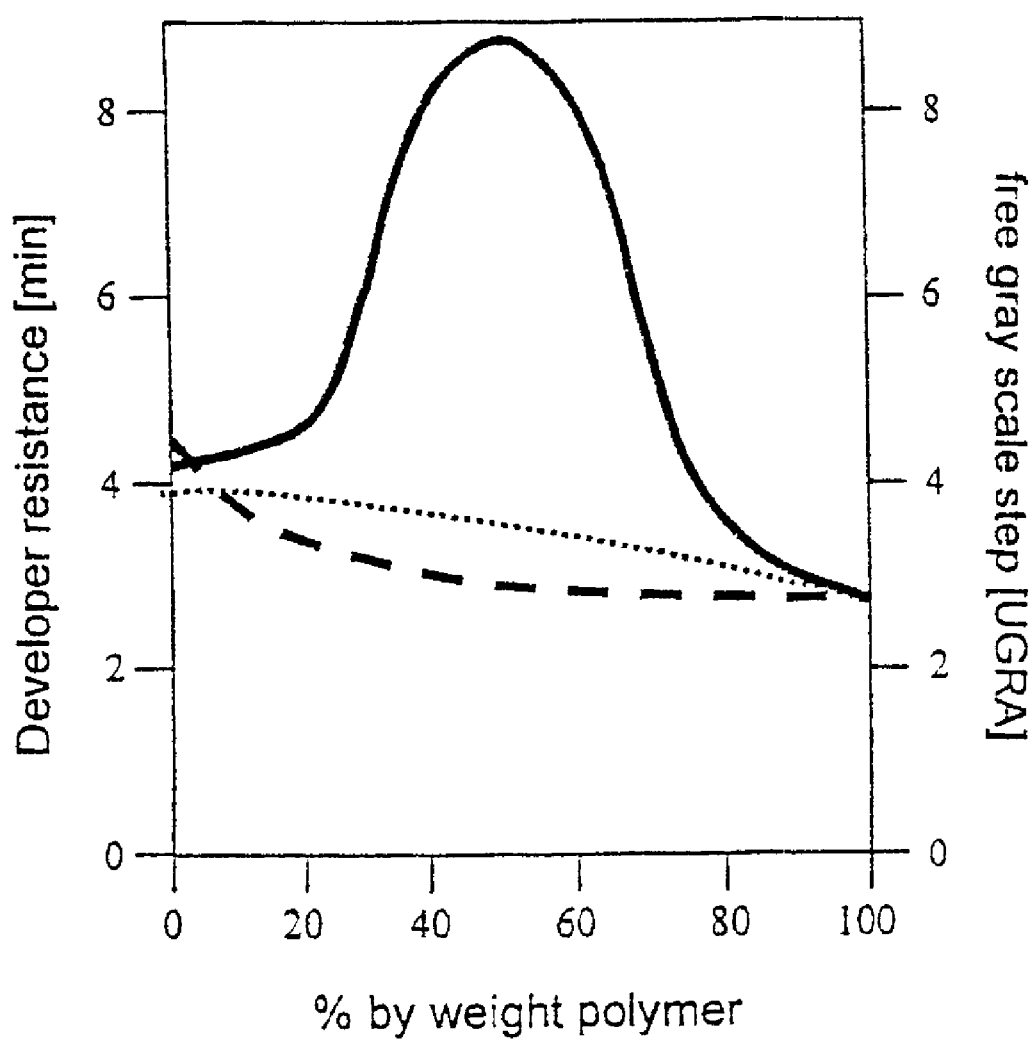
FIG. 1 shows the developer resistance behavior and the photosensitivity of a series of novolak/copolymer mixtures. The NQD content is kept at a constant 21% by weight throughout the series. The dotted line shows the expected curve of the developer resistance, the solid line shows the values found in the experiments. The dashed line shows the photosensitivity (i.e. the free grey scale steps).

The copolymer of the present invention is a terpolymer, the backbone thereof consists of units A to C.

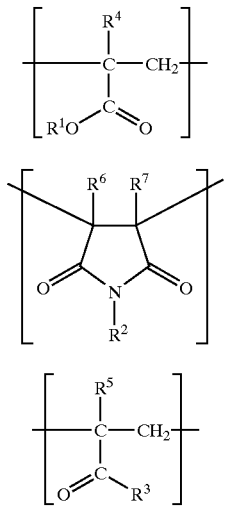

each of which having a certain function in the copolymer.

Structural unit A is responsible for the alkali-solubility of the copolymer according to the present invention. As a prerequisite, the homopolymer of monomer A has to be alkali-soluble; however, although it may be water-soluble, this is not required.

Structural unit B is mainly responsible for a high glass temperature of the copolymer and thus also prevents a rapid penetration of organic solvents. As a prerequisite, the homopolymer of B has to have a high glass transition temperature, preferably above 100° C.

Structural unit C ensures a sufficient hydrophilicity of the copolymer so that the copolymer can be developed quickly and completely and that there is no undesired skin formation during the developing process. As a prerequisite, the homopolymer of structural unit C has to be water-soluble which often also entails alkali-solubility.

The following applies throughout the application:

Unless otherwise defined, the term "alkyl" in this application is intended to signify straight-chain or branched alkyl groups with 1 to 12 carbon atoms, preferably 1 to 4 carbon atoms;

the term "cycloalkyl" signifies cycloalkyl groups with 3 to 8 ring-carbon atoms, preferably 5 or 6 ring-carbon atoms;

the term "aryl" signifies phenyl, naphthyl, anthryl or an N-substituted carbazole group; and the term "halogen" signifies fluorine, chlorine, bromine or iodine.

Unless stated otherwise, the terms "alkyl" and "cycloalkyl" comprise unsubstituted alkyl groups/cycloalkyl groups, as well as alkyl groups/cycloalkyl groups having at least one substituent selected from halogen atoms and —$NO_2$.

Furthermore, unless stated otherwise, the term "aryl" in the present application is intended to signify unsubstituted aryl groups as well as aryl groups having at least one substituent selected from halogen atoms, alkyl groups and —$NO_2$.

The term "alkoxy group" comprises alkoxy groups with 1 to 12 carbon atoms; the alkyl unit of the alkoxy groups can be branched, straight-chain or cyclic and may optionally contain one or several substituents selected from —OH, a halogen atom, an alkyl group and an aryl group.

Preferably, $R^1$ is hydrogen, aryl having at least one hydroxy group, and optionally at least one substituent selected from halogen, ($C_1$–$C_{12}$) alkyl and —$NO_2$, an arylsulfonamide group (like phenylsulfonamide) or ($C_1$–$C_{12}$) alkyl having at least one carboxy group. It is especially preferred when $R^1$ is hydrogen, hydroxyphenyl or carboxy-($C_1$–$C_4$) alkyl.

$R^4$ and $R^5$ are independently hydrogen, halogen or ($C_1$–$C_{12}$) alkyl. It is especially preferred when $R^4$ is H or —$CH_3$; the same applies for $R^5$.

$R^2$ is preferably hydrogen, aryl, optionally having one or several substituents selected from halogen, alkyl, —$NO_2$ and —OH, alkyl, cycloalkyl, an arylsulfonamide group (like phenylsulfonamide) or a sulfonamide group. It is especially preferred when $R^2$ is hydrogen, phenyl, cyclohexyl or hydroxyphenyl.

Preferably, $R^6$ and $R^7$ are independently hydrogen, halogen, ($C_1$–$C_4$) alkyl or phenyl. It is especially preferred when $R^6$ and $R^7$ are both hydrogen.

Preferably, $R^3$ is hydrogen, ($C_1$–$C_{12}$) alkyl having at least one hydroxy group and optionally also one or several substituents selected from halogen and —$NO_2$, ($C_3$–$C_8$) cycloalkyl having at least one hydroxy group and optionally also one or several substituents selected from halogen and —$NO_2$, aryl having at least one hydroxy group and optionally one or several substituents selected from halogen, ($C_1$–$C_{12}$) alkyl and —$NO_2$, a ($C_1$–$C_{12}$) alkylsulfonamide group, an arylsulfonamide group, —NH(CH$_2$)$_n$O-alkyl (wherein n is an integer from 1 to 20), —NHR$^8$ (wherein R$^8$ is hydrogen, (C$_1$–C$_{12}$) alkyl or aryl) or (C$_1$–C$_{12}$) alkoxy. It is especially preferred when R$^3$ is —NH$_2$ or —CH$_2$—CH$_2$—OH.

The content of monomer unit A in the copolymer of the present invention is at least 5 and at most 50 mol %, based on the copolymer, preferably, the content of A is 7 to 40 mol %, especially preferred 10 to 30 mol %. The content of unit B is 20 to 70 mol %, based on the copolymer, preferably 35 to 60 mol %. The content of unit C is 10 to 50 mol %, based on the copolymer, preferably 20 to 45 mol %.

The weight-average molecular weight of the copolymer is preferably 500 to 1,000,000, especially preferred 2,000 to 250,000.

The copolymer can be prepared from the monomers A', B' and C'

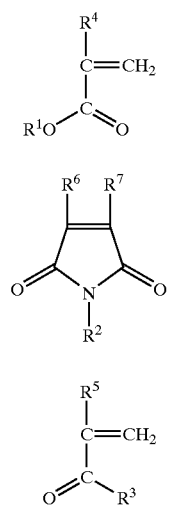

by means of known polymerization processes (e.g. solution polymerization, bulk polymerization, emulsion and suspension polymerization). Preferably, a solution containing monomers A', B' and C' is heated and a common initiator is added. It is also possible to add the initiator to the monomer mixture, then add an organic solvent and subsequently heat the resulting solution. R$^1$ to R$^7$ are as defined for A, B and C.

An especially preferred monomer A' is methacrylic acid. Especially preferred monomers B' are N-phenylmaleimide and N-cyclohexylmaleimide. Especially preferred monomers C' are methacrylamide and N-methoxymethyl methacrylate.

The copolymer according to the present invention is especially suitable as binder for radiation-sensitive compositions comprising at least one novolak and at least one naphthoquinone diazide derivative. It is not necessary to use novolak(s) and naphthoquinone diazide derivative(s) as separate components; naphthoquinone diazide derivative(s) reacted with novolak(s) can also be employed (which are referred to as "two-in-one" systems). The copolymer can be used both as a "stand-alone" binder, i.e. as the only binder, and as an additive, i.e. in addition to one or more other binders.

The preparation of the copolymer according to the present invention is inexpensive and it can synthetically easily be adapted to the individual compositions, i.e. independently of whether it is used as a "stand-alone" binder or as an additive, it can be adapted accordingly.

Printing forms etc. which are produced with such radiation-sensitive compositions are characterized by their high degree of chemical resistance, i.e. resistance to printing room chemicals and developers.

In order to take full advantage of the favorable properties of the radiation-sensitive compositions it is reasonable to adapt the copolymers to their intended use, i.e. whether they are used as an additive or as a stand-alone binder. This adaptation can easily be effected for example by modifying the monomer A content, which above all influences the alkali-solubility. If the intended use is as a resistance-increasing additive in a common positive working formulation, a higher content of unit A in the copolymer is recommended, preferably 20 to 40 mol %, than for a use as stand-alone binder for UV ink printing plates (preferably 5 to 20 mol %). In this connection, an important effect shown only by this group of copolymers plays a decisive role. The effect will be described in more detail below.

The basic working principle of a positive working system such as for example a printing plate involves the different rates at which exposed and unexposed image areas dissolve in the developer. Ideally, the exposed areas should dissolve as quickly as possible and the unexposed areas should not dissolve at all. The dissolution rate of the exposed elements determines the photosensitivity (or "speed") of a printing plate; the dissolution rate of the unexposed plate is the developer resistance. In practical applications, most of the time 1 to 4 minutes elapse between the point when the exposed areas are completely developed and the point when the unexposed areas are dissolved by the developer. This time period is also referred to as developer margin. In the case of especially aggressive developers, this margin can be considerably reduced so that it is often only slightly longer than the actual developing time (e.g. 15–30 seconds).

In the radiation-sensitive compositions, the copolymers in combination with novolaks and naphthoquinone diazide derivatives are able to markedly increase the developer margin without reducing the photosensitivity at the same time. As is shown in FIG. 1, the maximum developer resistance (solid line) occurs in the middle of a series of novolak/copolymer mixtures. This non-linear behavior clearly differs from the expected curve (dotted line). In contrast, the photosensitivity (dashed line) of the mixture series does not show a minimum, which would be expected, since formulations having a high developer resistance are generally less photosensitive.

This phenomenon of a resistance maximum does not occur in a mixture of novolak/copolymer lacking the NQD; in that case, a linear curve is obtained. Since all three components, i.e. novolak, copolymer and NQD, show an insolubilisation synergy in this effect, the effect is also referred to as "cross-insolubilisation" in the following.

If one starts from a composition comprising only the copolymer and NQD and keeps adding increasing amounts of novolak, the developer resistance increases. This is of particular interest for printing plates which are employed in UV ink printing; compositions suitable therefor require the highest possible chemical resistance and a favorable developer margin.

Figure 2:
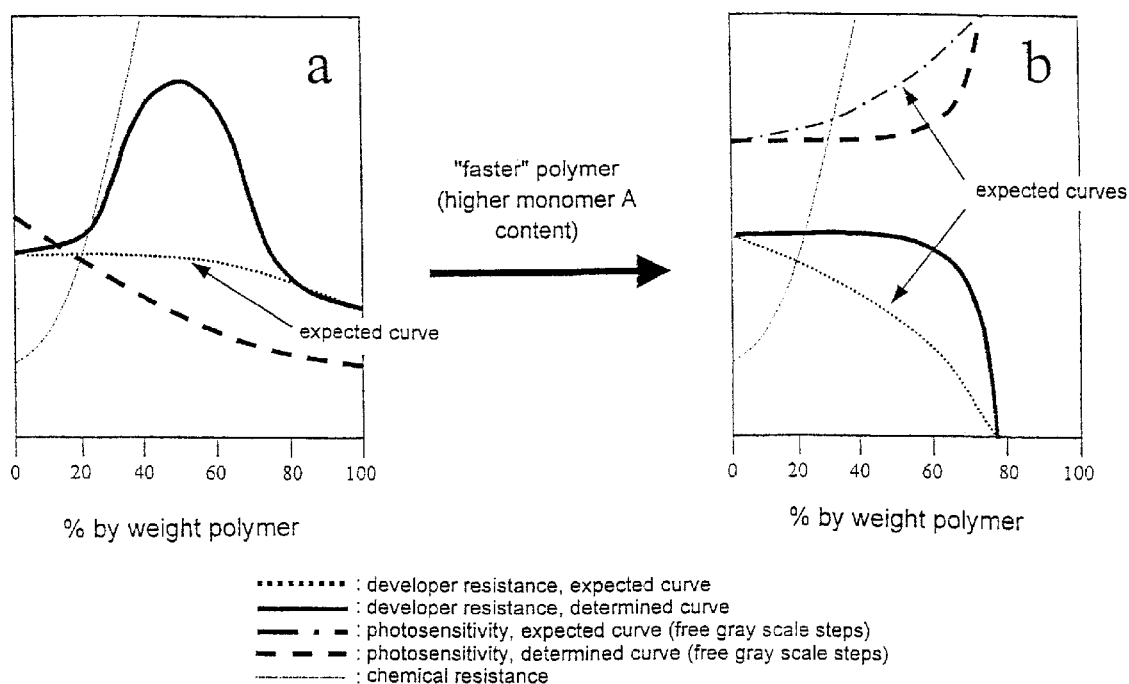
FIG. 2 shows the influence of the unit A content in the copolymer on the developer resistance, photosensitivity and chemical resistance at a constant NQD content of the composition (21% by weight).

In the case where it is merely intended to improve the chemical resistance of radiation-sensitive compositions based on novolak and NQD by means of the copolymer additive, it is preferred to increase the amount of unit A in the copolymer (see FIG. 2). If a polymer with a low unit A content is used (e.g. 15 mol %), the plate's photosensitivity is affected (as in FIG. 2a). Although the binder as a stand-alone binder together with an NQD (see FIG. 2b) shows hardly any developer resistance in a composition, the "cross-insolubilisation" effect makes it possible that at a content of up to 50% copolymer (based on the total amount of copolymer and novolak), good developer resistance is obtained without a decisive decrease in photosensitivity if the unit A content is increased (e.g. to 20% or more). In the case of common commercial additives (e.g. cellulose acetate hydrogenphthalate) containing a high amount of alkali-soluble groups for increasing the chemical resistance a rapidly falling curve of developer resistance would result, as shown in FIG. 2b by the dotted line. However, due to the "cross-insolubilisation" effect, the copolymers are able to keep both photosensitivity and developer resistance constant over a wide range; it is not until very high copolymer contents are reached that the system "overturns". The instant copolymers provide a significantly increased formulation margin compared to common resistance-increasing additives.

The resistance to aggressive chemicals is significantly increased, as can be inferred from FIG. 2b (in some cases 100-fold). In the photosensitive compositions it is irrelevant for the resistance to printing room chemicals whether the polymeric binder comprises a high or low content of e.g. unit A.

Furthermore, it was found that such positive working radiation-sensitive compositions, if they are convertible (also: reversible), show a markedly broadened conversion margin. In the tested cases, the conversion temperature could also be lowered which constitutes a practical advantage because oxidation and cross-linking processes at higher temperatures no longer occur.

On the one hand, the copolymers according to the present invention are additives which make it possible to drastically increase the chemical resistance to, e.g., printing room chemicals, of a positive working system such as, e.g. a printing plate, without affecting photosensitivity and developer resistance. On the other hand, these copolymers can also be employed as a main binder component in a positive working printing plate of the highest chemical resistance for UV-curing inks.

The ability of the copolymers to induce an insolubilisation synergism ("cross-insolubilisation effect") together with novolak and NQD is the key to this extremely flexible applicability.

As novolaks, all the polycondensation products from formaldehyde and phenols, obtained from acid catalysis or neutral catalysts, which are known to the person skilled in the art can be used.

All naphthoquinone diazide derivatives known to the person skilled in the art can be used. Examples include the ester from naphthoquinone-1,2-diazido-5-sulfonic acid chloride or -4-sulfonic acid chloride and 2,4-dihydroxybenzophenone or 2,3,4-trihydroxybenzophenone.

The weight ratio of novolak to copolymer in the inventive composition is preferably in the range of 90:10 to 10:90.

As a principle, the copolymer can be admixed in any ratio with a common positive working composition on the basis of NQD and novolak. At a ratio of novolak/copolymer of almost 100/0 to about 60/40 (% by weight), the copolymer can still be called an additive. A positive working printing plate produced therefrom shows a significantly improved chemical resistance compared to a printing plate whose photosensitive composition does not comprise the copolymer. If compositions with a novolak/copolymer ratio of about 40/60 to almost 0/100 (% by weight) are used for the production of positive working printing plates, printing plates of the highest chemical resistance are obtained which are perfectly suitable for printing processes using UV-curing inks.

In addition to the essential components (copolymer, novolak and NQD), the radiation-sensitive compositions can furthermore comprise one or more additional components selected from radiation-sensitive acid donors, dyes or pigments for increasing the contrast of the image, exposure indicators, plasticizers and mixtures thereof.

The exposure indicators suitable for use in the radiation-sensitive compositions are known to the person skilled in the art. Exposure indicators selected from triarylmethane dyes (such as Victoria Pure Blue BO, Victoria Blue R, crystal violet) or azo dyes (such as 4-phenylazodiphenylamine, azobenzene or 4-N,N-dimethylaminoazobenzene) are preferred. The exposure indicators may be present in the composition in an amount from 0.02 to 10% by weight, especially preferred in an amount from 0.5 to 6% by weight.

Suitable dyes for increasing the contrast of the image include those which dissolve well in the solvent or solvent mixture used for the coating or which can be introduced as a pigment in particulate form. Suitable contrast dyes include, e.g., rhodamine dyes, methyl violet, anthraquinone pigments and phthalocyanin dyes or pigments.

Suitable plasticizers include dibutylphthalate, triarylphosphate and dioctylphthalate. Dioctylphthalate is especially preferred. The plasticizer is preferably used in an amount of 0.25 to 2% by weight.

Based on the total weight, the radiation-sensitive composition preferably comprises 2 to 90% by weight of the copolymer, more preferably 7 to 80% by weight and most preferred 10 to 70% by weight.

The photosensitive compositions can be used in the production of printing forms (in particular offset printing plates), printed circuit boards for integrated circuits and photomasks.

The carrier to be used for the printing plate is preferably a material in the form of a sheet or a film, having a good dimensional stability. As such a dimensionally stable sheet or film material, use is preferably made of a material that has already been used as a carrier for printed matter. Examples of such carriers include paper, paper coated with plastic materials (such as polyethylene, polypropylene, polystyrene), metal sheets or foils, such as e.g. aluminum (including aluminum alloys), zinc and copper sheets, plastic films made from e.g. cellulose diacetate, cellulose triacetate, cellulose propionate, cellulose acetate, cellulose acetate butyrate, cellulose nitrate, polyethyleneterephthalate, polyethylene, polystyrene, polypropylene, polycarbonate and polyvinylacetate, and a laminate comprising paper or a plastic film and one of the above-mentioned metals, or a paper/plastic film which has been metallized by chemical vapor deposition. Among these carriers, an aluminum sheet or foil is especially preferred since it has a remarkable dimensional stability, is inexpensive and furthermore shows an excellent adhesion of the radiation-sensitive layer. Furthermore, a composite film can be used wherein an aluminum foil has been laminated onto a polyethyleneterephthalate film.

A metal carrier, in particular an aluminum carrier, is preferably subjected to a surface treatment, for example graining by brushing in a dry state, brushing with abrasive suspensions or electrochemically, e.g. in a hydrochloric acid electrolyte, and optionally to anodic oxidation.

The invention will be described in more detail with reference to the examples below.

EXAMPLES

Synthesis Example

The monomers listed in Table 1 below were used to prepare copolymers. For polymerization, the monomers were provided in a flask with a stirrer and nitrogen inlet at 60° C. in methylglycol (total monomer concentration: 2.5 mol/l) and 0.1 mol % azobisisobutyronitrile was added as initiator. Reprecipitation was carried out in three times the amount of methanol. The obtained copolymers were dried for 48 h at 50° C.

TABLE 1

Monomer content (in mol %) of different copolymers

| Monomers Copolymer | A' Methacrylic acid | A' Carboxyphenyl-methacrylate | A' APK* | B' N-Phenylmaleimide | B' N-Cyclohexyl-maleimide | C' Methacrylamide | C' Hydroxyethyl-methacrylate | C' N-Methoxymethyl-methacrylamide |
|---|---|---|---|---|---|---|---|---|
| P1 | 15 | | | 50 | | 35 | | |
| P2 | 20 | | | 45 | | 35 | | |
| P3 | 25 | | | 40 | | 35 | | |
| P4 | 30 | | | 35 | | 35 | | |
| P5 | 15 | | | 50 | | | | 35 |
| P6 | 15 | | | | 50 | 35 | | |
| CP1 | | 15 | | 40 | | 45 | | |
| CP2 | | | 35 | 35 | | 30 | | |
| CP3 | Terpolymer from 50% methylvinylether, 25% N-sulfoneamidophenylmaleimide and 25% N-sulfoneamidocyclohexylmaleimide | | | | | | | |
| CP4 | 15 | | | 50 | | | 35 | |

*APK is:

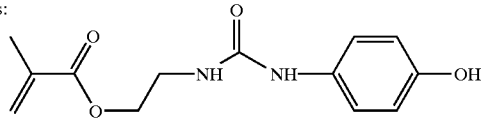

Furthermore, in order to improve the hydrophilic properties of the surface of the grained metal carrier which has optionally been anodically oxidized in sulfuric or phosphoric acid, it is subjected to an aftertreatment in an aqueous solution of sodium silicate, calcium zirconium fluoride, polyvinyl phosphonic acid or phosphonic acid.

The details of the above-mentioned pretreatment of the substrate are well known to the person skilled in the art.

The subsequently dried plates are coated with the radiation-sensitive layers of organic solvents or solvent mixtures such that dry layer weights preferably in the range of 0.5 to 4 g/m², especially preferred 0.8 to 3 g/m² are obtained.

In some cases it may be advantageous to additionally apply an oxygen- and/or moisture-blocking overcoat on the radiation-sensitive layer.

The printing plates thus produced are exposed and developed by means of common processes known to the person skilled in the art. The developed plates are usually treated with a preservative ("rubber coating"). The preservatives are aqueous solutions of hydrophilic copolymers, wetting agents and other known additives.

Copolymers CP1, CP2, CP3 and CP4 are comparative copolymers.

Copolymers P1–P6 can be prepared very inexpensively; the costs for the monomer raw material lie in the range of 5–25 DM/kg. Also, there is not much solvent waste since high concentrations and little precipitator are used. In the case of the comparative copolymers CP2 and CP3, the costs for the raw materials are considerably higher, in particular the APK monomer in CP2 has to be prepared in a complicated manner via the expensive intermediate methacryloyloxyethylisocyanate.

Preparation Example 1

The copolymers obtained in the Synthesis Example were added to positive working radiation-sensitive standard compositions for printing plates. In addition to a naphthoquinone diazide and a novolak, these standard compositions also comprised a photosensitive acid donor and a pigment for increasing the contrast of the image between exposed and unexposed areas (see Table 2).

TABLE 2

Standard compositions with the copolymers from Table 1 (in % by weight)

| Ratio copolymer:novolak | No. A0 Reference (0% copolymer) | No. A1 20/80 copolymer/novolak | No. A2 40/60 copolymer/novolak | No. A3 60/40 copolymer/novolak | No. A4 80/20 copolymer/novolak | No. A5 100/0 copolymer/novolak |
|---|---|---|---|---|---|---|
| Ester from naphthoquinone-1,2-diazido-5-sulfonic acid-chloride and 2,4-hydroxy-benzophenone (85% reacted) | 21.0 | 21.0 | 21.0 | 21.0 | 21.0 | 21.0 |
| Cresol/formaldehyde novolak resin (meta:para = 75/25), Mw = 7,000 | 76.6 | 61.3 | 46.0 | 30.6 | 15.3 | — |
| Copolymer from Table 1 | — | 15.3 | 30.6 | 46.0 | 61.3 | 76.6 |
| 2,4-Trichloromethyl-6[1(4-methoxy)-naphthyl)]1,3,5-triazine | 1.0 | 1.0 | 1.0 | 1.0 | 1.0 | 1.0 |
| Ethyl violet (triphenylmethane dye) | 1.4 | 1.4 | 1.4 | 1.4 | 1.4 | 1.4 |

From charges A0 to A5, the solids components were dissolved with methylglycol to give a 10% solution. After filtration of the solution, it was applied by means of a common process to an electrochemically grained and anodized aluminum foil which had been subjected to an after-treatment with polyvinyl phosphonic acid and was dried, at first without air supply and heating. Final drying took place for 5 minutes at 100° C. The dry layer weight was 2 g/m² in all cases.

The copying layer was exposed by means of a metal halide lamp (MH-Burner 5,000 W, company Sack) with 800 mJ/cm² under a silver film half-step scale (UGRA grey scales) with a density range of 0.15 to 1.95, wherein the density increments were 0.15, as a positive copy.

The exposed layer was treated for 15 seconds with a developer solution consisting of:
  87.79% by weight demineralized water;
  9.20% by weight soda waterglass;
  2.10% by weight sodium hydroxide;
  0.90% by weight ethylene glycol; and
  0.01% by weight tetramethylammoniumchloride (50% aqueous solution).

Subsequently, the developer solution was again rubbed onto the surface with a wet cloth for 5 seconds and then the entire plate was rinsed with water. After this treatment the unexposed areas remained on the plate. In order to evaluate photosensitivity and ink acceptance of the plate, the wet plate was blackened with printing ink. The products PC 904™ (available from Polychrome) and RC 43™ (available from Hoechst) were used as printing ink. The results are shown in Table 3. Regarding the entries in the table marked "soak loss", an evaluation was not possible because these samples had already been attacked by the developer.

TABLE 3

Photosensitivity of the plate formulations from Table 2 (UGRA step free)

| Copolymer | No. A0 Reference (0% copolymer) | No. A1 20/80 copolymer/novolak | No. A2 40/60 copolymer/novolak | No. A3 60/40 copolymer/novolak | No. A4 80/20 copolymer/novolak | No. A5 100/0 copolymer/novolak |
|---|---|---|---|---|---|---|
| P1 | 5 | 4 | 2 | 2.5 | 2.5 | 2.5 |
| P3 | 5 | 5 | 5 | 6 | soak loss | soak loss |
| P4 | 5 | 6 | soak loss | soak loss | soak loss | soak loss |
| CP1 | 5 | 6 | soak loss | soak loss | soak loss | soak loss |
| CP2 | 5 | 4 | 4 | 3.5 | 3.5 | 3.5 |
| CP3 | 5 | 5.5 | soak loss | soak loss | soak loss | soak loss |
| CP4 | 5 | 3.5 | 1.5 | 1 | <1 | <1 |

As can be inferred from Table 3, copolymer P3 showed a constant photosensitivity beyond a novolak/P3 ratio of higher than 40/60% by weight. Thus, this copolymer was particularly suitable as an additive for increasing the chemical and solvent resistance without having a negative effect on the developer resistance and photosensitivity (which will be explained further in Table 4).

The comparative copolymers CP1 and CP3 showed a weak resistance which limits their application range in the plate; a formulation may not contain more than 20%. CP4 required high exposure times in a formulation.

In order to examine developability of the exposed layer and to be able to compare it with other formulations, the following steps were carried out: at intervals of 5 seconds, the above developer solution was applied streak-wise to the exposed plate by means of a pipet. After a dwell time of 20 seconds, the entire plate was quickly rinsed with water, blackened with printing ink and then dried. The time period of developer action after blackening was determined after which the layer no longer accepted ink (in the following, this test is referred to as the "drop test").

In all samples A0–A5, the plate was completely developed after only 5 seconds.

In order to examine the developer resistance of the unexposed layer (the image areas), the above developer solution was applied streak-wise to an unexposed plate at intervals of 30 seconds by means of a pipet. After a dwell time of 4 minutes, the entire plate was quickly rinsed with water. If necessary, this time period can also be extended. The point of time of developer action was determined at which the layer showed clear light areas (in the following, this test is referred to as the "soak test").

Table 4 shows the developer resistance of positive working formulations from Table 2 with different copolymers of Table 1 at different novolak/copolymer ratios.

the exposed part showed resistance for more than 0.5 minutes, this value was noted down as well.

In order to evaluate the resistance of the photosensitive layer to extremely aggressive rinsing agents which usually contain high amounts of solvents (ethers, ester, ketones and the like) as used in printing with UV-curing inks, a laboratory test washing agent was used. The composition of the test washing agent was as follows: 80% by weight diacetone alcohol (DAA) and 20% by weight water. The test was carried out as follows: The upper third of a printing plate sample with a size of about 18×6 cm was exposed and the above UV washing agent was applied streak-wise by means of a pipet at intervals of 30 seconds. After a dwell time of 2 minutes, the entire plate was quickly rinsed with water and rubbed with a moist cloth. If necessary, this time period can be extended. The point of time of action is determined at which the layer showed clear light areas. In cases where two samples showed the same resistance on the unexposed part, the value of the exposed third was also taken into consideration.

TABLE 4

Developer resistance (in minutes) using the different copolymers from Table 1

|     | No. A0 Reference (0% copolymer) | No. A1 20/80 copolymer/novolak | No. A2 40/60 copolymer/novolak | No. A3 60/40 copolymer/novolak | No. A4 80/20 copolymer/novolak | No. A5 100/0 copolymer/novolak |
| --- | --- | --- | --- | --- | --- | --- |
| P1  | 3 | 4 | 8 | 8 | 4 | 2 |
| P3  | 3 | 4 | 3 | 1 | <1 | <1 |
| P4  | 3 | 3 | 2 | <1 | <1 | <1 |
| CP1 | 3 | 2 | 2 | <1 | <1 | <1 |
| CP2 | 3 | 4 | 3 | 3 | 2 | 2 |
| CP3 | 3 | 2 | <1 | <1 | <1 | <1 |
| CP4 | 3 | 3 | 3 | 2 | 2 | 2 |

In order to evaluate the resistance of the photosensitive layer to aggressive, mostly alcohol-containing washing agents (e.g. film and glass cleansers and, in the printing room, cleansers for printing forms, rubber blankets and rolls), a laboratory test washing agent (WA) was used. This test allowed reliable statements regarding the chemical resistance to other organic solvents. The composition of the test washing agent was as follows: 20% by weight isopropanol (water content below 0.1%), 85% by weight gasoline 135/180 (also referred to as type K21) and 1% by weight water. The final water content was determined by means of the Karl Fischer technique and may vary by ±0.1%.

The test was carried out as follows: The upper third of a printing plate sample with a size of about 10×10 cm was exposed and immersed in a dry Petri dish which was filled with the washing agent and held at a temperature of ~25° C. At intervals of 1, 2, 3 and 4 minutes (if necessary, this time period can also be extended), a cloth was rubbed over the sample from top to bottom, exerting pressure. The unexposed half was evaluated. The time period (in minutes) was determined after which a clear loss of contrast could be observed (a loss of contrast of about 30%). In cases where Table 5 shows the chemical resistance of the individual compositions to common plate washing agents. The individual mixture series were divided for the washing agent tests:

Mixtures with a copolymer/novolak ratio of 0/100 up to and including 40/60% by weight were treated with the "normal" gasoline-containing rinsing agent. Samples with still higher copolymer contents showed too high a resistance to be evaluated with the test washing agent within a reasonable period of time.

The resistance of samples with a copolymer/novolak ratio of 60/40 to 100/0% by weight was tested with the UV washing agent. Here, it made little sense to also examine samples having a copolymer content of <60% by weight since they were attacked too early to be evaluated in a reasonable manner.

TABLE 5

| | Resistance to plate washing agents (in minutes) | | | | | |
|---|---|---|---|---|---|---|
| | No. B0 Reference (0% copolymer) | No. B1 20/80 copolymer/novolak | No. B2 40/60 copolymer/novolak | No. B3 60/40 copolymer/novolak | No. B4 80/20 copolymer/novolak | No. B5 100/0 copolymer/novolak |
| | gasoline-containing washing agent | | | DAA/Water | | |
| P1 | <1 | 16 | >>16 | 2 | 2 | >2 |
| P3 | <1 | 16 | >>16 | 2 | — | — |
| P4 | <1 | 14 | >>16 | — | — | — |
| CP1 | <1 | 6 | 11 | — | — | — |
| CP2 | <1 | 4 | 8 | 2 | 2 | >2 |
| CP3 | <1 | 2 | — | — | — | — |
| CP4 | <1 | 5 | 6 | <0.5 | <0.5 | <0.5 |

As shown in the table, the chemical resistance of the inventive copolymers was very high whereby the different contents of methacrylic acid in the copolymers had little influence on the resistance properties. The chemical resistance of the comparative copolymers was significantly lower. The panels that have been left blank were not evaluated since these plates did not have sufficient developer resistance (see Table 4).

Printing tests

As described in Preparation Example 1, for preparing a printing plate a copying layer was applied to the aluminum substrate, exposed, developed and after rinsing with water the plate was squeezed and rubbed with an aqueous solution of 0.5% phosphoric acid and 6% gum arabic. The thus produced plate was mounted in a sheet-fed offset press (type Favorit, MAN Roland) and printing was carried out under the usual conditions. During printing, the machine was stopped after every 10,000 turns and the plate was washed with a plate washing agent consisting of 85% by volume gasoline and 15% by volume isopropanol. The obtained numbers of copies of some plates of Preparation Example 1, Table 1, are shown in Table 6.

TABLE 6

Obtained numbers of copies of Preparation Example 1, Table 2

| Sample | Copies |
|---|---|
| A0 without copolymer | 70,000 |
| A1 with copolymer P3 | 90,000 |
| A1 with copolymer CP2 | 80,000 |

In order to examine the resistance to aggressive alcohol substitutes in the fountain water, a high-concentrated substitute (5% Substifix™+5% isopropanol) was used in the fountain water. The numbers of copies of some plates from Preparation Example 1, Table 1, obtained with this type of fountain water are shown in Table 7.

TABLE 7

Obtained numbers of copies when using especially aggressive fountain water

| Sample | Copies |
|---|---|
| A0 without copolymer | 70,000 |
| A1 with copolymer P3 | 120,000 |
| A1 with copolymer CP2 | 100,000 |

In order to examine the resistance of the printing forms to UV-curing inks, the plate was washed every 10,000 turns with an aggressive washing agent instead of a normal plate washing agent. The obtained numbers of copies of some plates of Preparation Example 1, Table 1, are shown in Table 8.

TABLE 8

Obtained numbers of copies when using an aggressive UV-curing ink washing agent from Preparation Example 1, Table 2

| Sample | Copies |
|---|---|
| A0 without copolymer | 10,000* |
| A4 with copolymer P1 | 120,000 |
| A5 with copolymer CP2 | 110,000 |

*the first washing step already attacked the radiation-sensitive layer so considerably that printing was discontinued.

In all three cases it became apparent that the numbers of copies of plates with the inventive copolymers was considerably higher than that of printing plates not comprising a copolymer or the comparative copolymers. Compared to CP2, copolymer P1 was superior, which is significant since the production costs of P1 are about ten times lower than those of CP2.

Baking Tests

For thermal stabilization (baking) of the samples, they were heated in an oven to 250° C. for 8 minutes.

For determining the mechanical abrasion resistance, the printing plates were subjected to an abrasion test. During that test, a cloth soaked with an aqueous abrasive suspension rubbed over the plate in an oscillating movement for a defined period of time (15 minutes). The lower the weight loss in this process, the higher the mechanical resistance of a sample. By selecting the abrasive emulsion accordingly, this test was adjusted such that it allowed a qualitative prediction of the number of copies yielded by the printing plate in a printing press.

The mechanical stability was determined indirectly by means of a chemical test. For this purpose, a correction fluid for positive working plates (type 243, available from Kodak Polychrome Graphics) was left to react with the layer for 15 minutes. If no attack could be observed, the cross-linking of the binder components and thus the chemical (and mechanical) resistance was deemed sufficient.

The results of the tests described above are shown in Table 9.

TABLE 9

Mechanical and chemical resistance of the plates (formulations from Table 2)

| Sample | Weight loss [g/m$^2$] non-baked samples | Weight loss [g/m$^2$] baked samples | Correction fluid test [min] |
|---|---|---|---|
| A0 without copolymer | 0.85 | 0.73 | >15 |
| A4 with P1 | 0.82 | 0.80 | 2–3 |
| A1 with P3 | 0.78 | 0.65 | >15 |

The combination of Sample A4 with P1, represents a UV-curing ink printing plate. The combination of Sample A1 with P3 represents a highly washing agent-resistant conventional positive working plate.

While the UV-curing ink plate (Sample P1) reached the same mechanical strength as a normal positive working printing plate, it still responded to correction fluids. This represents an almost ideal behavior: the printing plate showed the highest possible mechanical strength, but could still be corrected. This property is very user-friendly since it also allows the correction of a plate which has already been baked and which otherwise would have been discarded.

Preparation Example 2

In order to demonstrate that the inventive copolymers are not only directed to a certain type of novolak or NQD, the corresponding components from Table 2 were replaced by differently structured derivatives as shown in Tables 10 to 12. The copolymer in this series was not modified; P1 was used in all formulations.

Naphthoquinone diazides polymer-analogously esterified with a novolak (grafted) constitute a special case, i.e. this class of substances already carries the NQD in the main chain of the novolak so that it is not necessary to incorporate NQDs. Thus, those two substances not only replaced the novolak part but additionally also the NQD part of the formulations in Table 2. In this connection, it should be noted that an addition of copolymer to the composition automatically decreases the NQD content, which is not the case in other compositions. Therefore, it was not necessary to examine formulations comprising more than 60% copolymer.

TABLE 10

Developer resistance in (in minutes) of different novolaks with copolymer P1

| | No. C0 Reference (0% copolymer) | No. C1 20/80 copolymer/novolak | No. C2 40/60 copolymer/novolak | No. C3 60/40 copolymer/novolak | No. C4 80/20 copolymer/novolak | No. C5 100/0 copolymer/novolak |
|---|---|---|---|---|---|---|
| Novolaks | | | | | | |
| Cresol/formaldehyde novolak resin (meta: para = 75/25), Mw = 7,000 | 3 | 4 | 8 | 8 | 3 | 2 |
| Cresol/formaldehyde novolak resin (meta: para = 60/40), Mw = 4,000 | 2 | 4 | 8 | 8 | 3 | 2 |
| Cresol/phenol/ formaldehyde novolak resin, Mw = 7,000 | 2 | 4 | 8 | 8 | 3 | 2 |
| meta-Cresol/ formaldehyde novolak resin, Mw = 13,000 | 4 | 5 | 8 | 4 | 3 | 2 |
| meta-Cresol/ formaldehyde novolak resin, Mw = 7,000 | 3 | 5 | 5 | 4 | 2 | 2 |
| polymer-analogously grafted NQDs | | | | | | |
| 2,1,4-NQD, esterified polymer-analogously with a cresol/phenol/ formaldehyde novolak (Mw = 4,000) (reacted ~6%) | 1 | 3 | 2 | 1 | — | — |
| 2,1,4-NQD, polymeranalog esterified with a cresol/phenol/ formaldehyde novolak (MW = 7,000) (reacted ~6%). | 3 | 4 | 3 | 2 | — | — |

As can be inferred from Table 10, a markedly increased developer resistance can be observed in the medium range of novolak/copolymer ratios (similarly as shown in FIG. 2a). This shows that the inventive copolymers exhibited a "cross-insolubilisation" effect with differently structured novolaks as well. In short-chain novolaks, the "cross-insolubilisation" effect was somewhat less pronounced than in the long-chain varieties.

TABLE 11

Photosensitivity (UGRA grey scale step free) of different novolaks with copolymer P1.

|  | No. C0 Reference (0% copolymer) | No. C1 20/80 copolymer/novolak | No. C2 40/60 copolymer/novolak | No. C3 60/40 copolymer/novolak | No. C4 80/20 copolymer/novolak | No. C5 100/0 copolymer/novolak |
|---|---|---|---|---|---|---|
| Novolaks |  |  |  |  |  |  |
| Cresol/formaldehyde novolak resin (meta:para = 75/25), Mw = 7,000 | 4 | 3.5 | 3.5 | 3 | 2.5 | 2 |
| Cresol/formaldehyde novolak resin (meta:para = 60/40), Mw = 4,000 | 5.5 | 5 | 4 | 3.5 | 3 | 3.5 |
| Cresol/phenol/formaldehyde novolak resin, Mw = 7,000 | 5 | 4.5 | 4.5 | 4 | 3.5 | 3 |
| meta-cresol/formaldehyde novolak resin, Mw = 13,000 | 3 | 3 | 2.5 | 2 | 1.5 | 1 |
| meta-cresol/formaldehyde novolak resin, Mw = 7,000 | 4.5 | 4 | 4 | 3.5 | 3 | 3 |
| polymer-analogously grafted NQDs |  |  |  |  |  |  |
| 2,1,4-NQD, esterified polymer-analogously with a cresol/phenol/formaldehyde novolak (Mw = 4,000) (reacted ~6%) | 4 | 3 | 2.5 | 3 | — | — |
| 2,1,4-NQD, esterified polymer-analogously with a cresol/phenol/formaldehyde novolak (MW = 7,000) (reacted ~6%) | 3 | 3 | 2.5 | 2.5 | — | — |

As can be inferred from Table 11, at an increasing copolymer/novolak ratio, all novolaks showed a similar behavior in the course of the exposure times.

TABLE 12

Resistance to washing agents (in minutes) of different novolaks with copolymer P1.

|  | No. C0 Reference (0% copolymer) | No. C1 20/80 copolymer/novolak | No. C2 40/60 copolymer/novolak | No. C3 60/40 copolymer/novolak | No. C4 80/20 copolymer/novolak | No. C5 100/0 copolymer/novolak |
|---|---|---|---|---|---|---|
| Novolaks |  |  |  |  |  |  |
| Cresol/formaldehyde novolak resin (meta: | >1 | 16 | <16 | <16 | <16 | <16 |

TABLE 12-continued

Resistance to washing agents (in minutes) of different novolaks with copolymer P1.

|  | No. C0 Reference (0% copolymer) | No. C1 20/80 copolymer/novolak | No. C2 40/60 copolymer/novolak | No. C3 60/40 copolymer/novolak | No. C4 80/20 copolymer/novolak | No. C5 100/0 copolymer/novolak |
|---|---|---|---|---|---|---|
| para = 75/25), Mw = 7,000 |  |  |  |  |  |  |
| Cresol/formaldehyde novolak resin (meta: para = 60/40), Mw = 4,000 | >1 | 8 | 16 | <16 | <16 | <16 |
| Cresol/phenol/ formaldehyde novolak resin, Mw = 7,000 | >1 | 12 | 16 | <16 | <16 | <16 |
| meta-Cresol/ formaldehyde novolak resin, Mw = 13,000 | 2 | <16 | <16 | <16 | <16 | <16 |
| meta-Cresol/ formaldehyde novolak resin, Mw = 7,000 | >1 | 6 | 16 | <16 | <16 | <16 |
| polymeranalogously grafted NQDs |  |  |  |  |  |  |
| 2,1,4-NQD, esterified polymer-analogously with a cresol/phenol/ formaldehyde novolak (Mw = 4,000) (reacted ~6%) | >1 | 8 | 16 | <16 | <16 | <16 |
| 2,1,4-NQD, esterified polymer-analogously with a cresol/phenol/ formaldehyde novolak (MW = 7,000) (reacted ~6%). | 1 | 12 | <16 | <16 | <16 | <16 |

As can be inferred from Table 12, at least starting at a copolymer content of about 40% all samples were sufficiently resistant to the test washing agent.

Preparation Example 3

In positive working compositions as used in convertible printing plates, the inventive copolymers exhibited an expansion of the conversion margin and a decrease of the lower conversion temperature. Two different systems are shown in Tables 13 and 15 and the results are shown in Tables 14 and 16.

TABLE 13

Influence of the copolymers on the conversion properties (weight of sample in grams)

|  | Reference without copolymer | with P3 | with CP2 |
|---|---|---|---|
| Ester of a low-molecular novolak with 1,2-naphthoquinone diazide-4-sulfonic acid | 21.00 | 21.00 | 21.00 |
| Cresol/formaldehyde novolak resin (meta: para = 75/25), Mw = 7,000 | 77.00 | 57.40 | 57.40 |
| P3 | — | 20.60 | — |
| CP2 | — | — | 20.60 |
| 2,4-Trichloromethyl-6[1(4-methoxy)-naphthyl)]1,3,5-triazine | 0.50 | 0.50 | 0.50 |
| Ethyl violet (triphenylmethane dye) | 1.50 | 1.50 | 1.50 |

The compositions of Table 13 were used to coat plates, the plates were exposed and then tempered for 5 minutes at different temperatures as shown in Table 14. Subsequently, the printing plates were subjected to overall exposure. Then the plates were developed.

TABLE 14

Conversion properties of the compositions from Table 13

|  | 115° C. | 125° C. | 135° C. | 145° C. | 155° C. |
|---|---|---|---|---|---|
| Reference | − | +/− | + | + | n.d. |
| + P3 | − | + | + | + | n.d. |
| + CP2 | − | − | + | n.d. | n.d. |

− developer resistance of the converted layer too weak
+ optimum conversion
n.d. plate cannot be completely developed Compared to the reference sample, the sample with copolymer P3 showed an expanded conversion margin shifted towards lower temperatures. If only for the narrow margin in which conversion was possible, the sample with the reference polymer is only conditionally recommended for this purpose.

The photosensitivity of the formulation with the inventive copolymer as well was improved compared to the reference sample: The solid steps in the UGRA grey step showed about one more grey scale (on the converted side). The sample with the comparative polymer was not taken into account.

TABLE 15

Influence of the copolymers on the conversion properties (given in % by weight)

| | Reference without copolymer | with P1 | with CP2 |
|---|---|---|---|
| 2,1,4-NQD polymer analog esterified with a cresol/phenol/formaldehyde novolak (Mw = 4,000) (reacted ~6%) | 97.60 | 82.00 | 82.00 |
| P1 | — | 15.60 | — |
| CP2 | — | — | 15.60 |
| 2,4-Trichloromethyl-6[1(4-methoxy)-naphthyl)]1,3,5-triazine | 1.00 | 1.00 | 1.00 |
| Ethyl violet (triphenylmethane dye) | 1.40 | 1.40 | 1.40 |

The compositions of Table 15 were used to coat plates, the plates were exposed and then tempered for 5 minutes at different temperatures as shown in Table 16. Subsequently, the printing plates were subjected to overall exposure. Then the plates were developed.

TABLE 16

Conversion properties of the compositions from Table 15

| | 115° C. | 125° C. | 135° C. | 145° C. | 155° C. |
|---|---|---|---|---|---|
| Reference | − | − | + | + | n.d. |
| + P1 | − | +/− | + | + | n.d. |
| + CP2 | − | − | + | n.d. | n.d. |

− developer resistance of the converted layer too weak
+ optimum conversion
n.d. plate cannot be completely developed Compared to the reference sample, the sample with copolymer P1 shows an expanded conversion margin shifted towards lower temperatures. This is consistent with the findings in Table 14. If only for the narrow margin in which conversion was possible, the sample with the reference polymer is only conditionally recommended for this purpose.

The photosensitivity of the formulation with the inventive copolymer as well was improved compared to the reference sample: the solid steps in the UGRA grey step show about one more grey scale (on the converted side). The sample with the comparative polymer was not taken into account.

Figure 3:
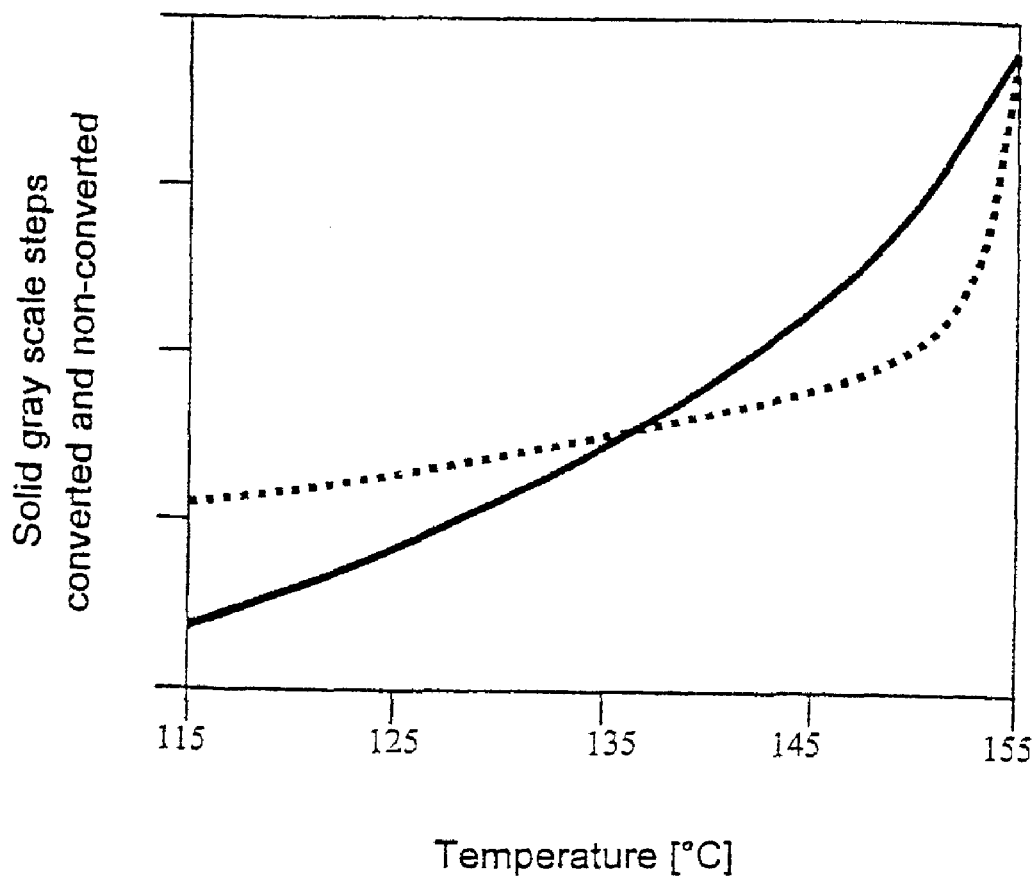
FIG. 3 shows the photosensitivity of the compositions of converted plates with (dotted line) and without (solid line) copolymer P3 as a function of the conversion temperature.

In FIG. 3, the solid UGRA grey scale steps are shown as an indication of the photosensitivity of the compositions (from Tables 14 and 16) with the inventive copolymer (dotted line) and without the inventive copolymer (solid line).

It can be inferred from FIG. 3 that the formulations comprising the inventive copolymer exhibited a broader and more gradual working range. Thus, the temperature margin for conversion was larger. The samples without copolymer showed a relatively regular increase in photosensitivity at increasing temperatures, which is less desirable from a practical point of view.

The invention claimed is:

1. A copolymer comprising the units A, B and C wherein unit A is present in an amount of 5 to a maximum of 50 mol % and has the following formula:

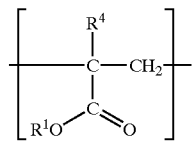

A wherein $R^1$ and $R^4$ are selected such that the homopolymer of A is alkali-soluble, unit B is present in an amount of 20–70 mol % and has the following formula:

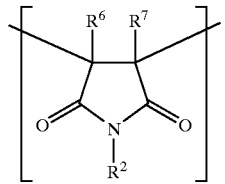

B wherein $R^2$, $R^6$ and $R^7$ are selected such that the homopolymer of B has a glass transition temperature above 100° C., and unit C is present in an amount of 10–50 mol % and has the following formula:

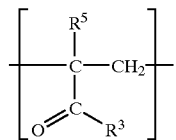

C wherein $R^3$ and $R^5$ are selected such that the homopolymer of C is water-soluble,
with the proviso that unit C is different from unit A.

2. The copolymer according to claim 1 wherein $R^1$ is (i) hydrogen, (ii) aryl having at least one hydroxy group and optionally having at least one substituent selected from the group consisting of halogen, ($C_1$–$C_{12}$) alkyl and —$NO_2$, (iii) arylsulfonamide or (iv) ($C_1$–$C_{12}$) alkyl having at least one carboxy group.

3. The copolymer according to claim 1 wherein $R^4$ and $R^5$ independently are hydrogen, halogen or ($C_1$–$C_{12}$) alkyl.

4. The copolymer according to claim 1 wherein $R^2$ is (i) hydrogen, (ii) aryl optionally having one or more substituents selected from the group consisting of halogen, ($C_1$–$C_{12}$) alkyl, —$NO_2$ and —OH, (iii) ($C_1$–$C_{12}$) alkyl, (iv) ($C_3$–$C_8$) cycloalkyl, (v) arylsulfone amide or (vi) sulfonamide.

5. The copolymer according to claim 1 wherein $R^3$ is (i) hydrogen, (ii) ($C_1$–$C_{12}$) alkyl having at least one hydroxy group and optionally one or more substituents selected from the group consisting of halogen and —$NO_2$, (iii) ($C_3$–$C_8$) cycloalkyl having at least one hydroxy group and optionally one or more substituents selected from the group consisting of halogen and —$NO_2$, (iv) aryl having at least one hydroxy group and optionally one or more substituents selected from the group consisting of halogen, ($C_1$–$C_{12}$) alkyl and —$NO_2$, (v) ($C_1$–$C_{12}$) alkylsulfonamide, (vi) arylsulfone amide, (vii) —$NH(CH_2)_n$O alkyl wherein n is an integer of 1–20, (viii) —$NHR^8$ wherein R is hydrogen, ($C_1$–$C_{12}$) alkyl or aryl or (ix) a ($C_1$–$C_{12}$) alkoxy group.

6. The copolymer according to claim 1 wherein $R^6$ and $R^7$ independently are hydrogen, halogen, ($C_1$–$C_4$) alkyl or phenyl.

7. The copolymer according to claim 1 wherein the weight-average molecular weight is in the range of 500 to 1,000,000.

8. A process for the preparation of a copolymer comprising;
(a) providing a solution of the monomers A', B' and C' in an organic solvent, wherein A', B' and C' have the structures:

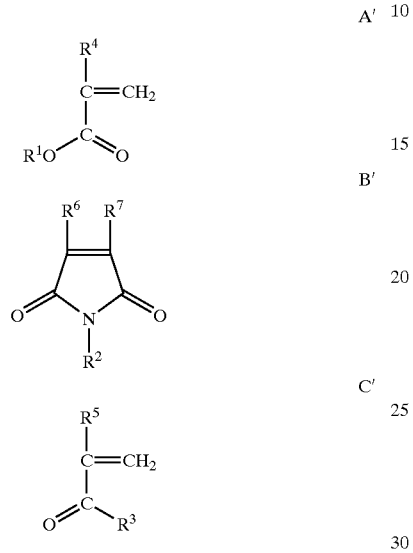

wherein: $R^1$ and $R^4$ are selected such that the homopolymer of A is alkali soluble; $R^2$, $R^6$ and $R^7$ are selected such that the homopolymer of B has a high glass transition temperature; and $R^3$ and $R^1$ are selected such that the homopolymer of C is water-soluble with the proviso that unit C is different from unit A;
(b) heating the solution; and
(c) adding the initiator.

9. A process for the preparation of a copolymer, comprising:
(a) providing a mixture of monomers A', B' and C' and an initiator, wherein A', B' and C' have the structures:

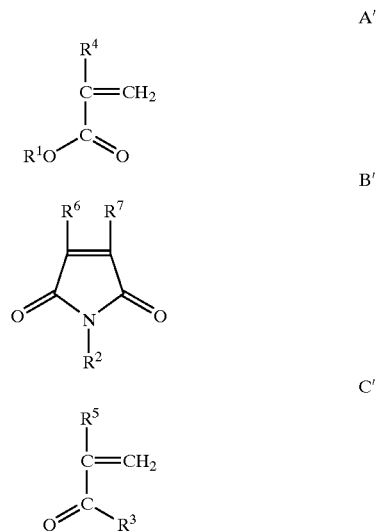

wherein: $R^1$ and $R^4$ are selected such that the homopolymer of A is alkali soluble; $R^2$, $R^6$ and $R^7$ are selected such that the homopolymer of B has a high glass transition temperature; and $R^3$ and $R^5$ are selected such that the homopolymer of C is water-soluble with the proviso that unit C is different from unit A;
(b) preparing a solution of the mixtures obtained in (a) by adding an organic solvent; and
(c) heating the solution.

* * * * *

UNITED STATES PATENT AND TRADEMARK OFFICE
CERTIFICATE OF CORRECTION

PATENT NO. : 6,525,152 B1
DATED : February 25, 2003
INVENTOR(S) : Mathias Jarek

It is certified that error appears in the above-identified patent and that said Letters Patent is hereby corrected as shown below:

Column 24,
Lines 63-64, should read as follows:
-- ...-$NHR^8$ wherein $R^8$ is hydrogen, ($C_1$-$C_{12}$) alkyl or aryl or ... --

Column 25,
Lines 35 and 36, should read as follows:
-- ... and $R^3$ and $R^5$ are selected such that the homopolymer of C is water-soluble ... --

Signed and Sealed this

Twenty-second Day of July, 2003

JAMES E. ROGAN
*Director of the United States Patent and Trademark Office*